United States Patent [19]

Shrinkle

[11] Patent Number: 4,634,896

[45] Date of Patent: Jan. 6, 1987

[54] METHOD AND APPARATUS FOR QUALIFYING VALID DATA PEAKS IN A READ/WRITE CHANNEL

[75] Inventor: Louis J. Shrinkle, Boulder, Colo.

[73] Assignee: Storage Technology Corporation, Louisville, Colo.

[21] Appl. No.: 676,750

[22] Filed: Nov. 30, 1984

[51] Int. Cl.[4] .................. H03K 5/01; H03K 5/153; G01R 29/02

[52] U.S. Cl. .................................. 307/351; 328/117; 328/164

[58] Field of Search ............... 307/350, 351, 358, 354, 307/360, 361, 530; 328/114, 117, 118, 119, 132, 164

[56] References Cited

U.S. PATENT DOCUMENTS 3,437,833 4/1969 Razaitis et al. ................... 307/351
3,631,263 12/1971 Graham et al. ................... 307/351
4,429,404 1/1984 Mai ................................ 307/350

Primary Examiner—John Zazworsky
Attorney, Agent, or Firm—Woodcock Washburn Kurtz Mackiewicz & Norris

[57] ABSTRACT

A circuit and method for qualifying valid data peaks within a raw readout signal. The raw readout signal is of the type generated when data is retrieved from magnetic storage devices. The raw readout signal is processed through four parallel channels. A first channel includes follow and hold circuitry that follows the signal level of the raw readout signal if the signal level is increasing, and holds the highest previously encountered signal level when the raw readout signal level is decreasing. The follow and hold circuitry also detects the occurrence of a prescribed polarity slope within the raw readout signal, providing the amplitude of the raw readout signal at the point where the slope is detected exceeds the value held in the follow and hold circuitry. The net effect of the first channel is thus to detect signal slopes leading to increasingly higher amplitude data peaks within a given positive or negative region of the raw readout signal, and to not detect slopes leading to data peaks of lesser amplitude than previous peaks. A second channel includes peak detection circuitry for detecting all peaks that occur within the raw readout signal. A third channel includes threshold detection circuitry for detecting when the raw readout signal exceeds a prescribed threshold. A fourth channel determines the polarity—positive or negative—of the raw readout signal. A data peak is initially qualified only if the first three channels indicate a concurrence of: (1) a prescribed slope, (2) a peak, and (3) an above-threshold condition. Data peaks for a given polarity region of the raw readout signal—which polarity region is defined by the polarity detection of the fourth channel—are finally qualified by eliminating all but the last of a series of initially qualified peaks.

14 Claims, 8 Drawing Figures 4,634,896

METHOD AND APPARATUS FOR QUALIFYING VALID DATA PEAKS IN A READ/WRITE CHANNEL

BACKGROUND OF THE INVENTION

The present invention relates to an apparatus and method for qualifying valid data peaks in a read/write channel of a magnetic tape or disk system. More particularly, the present invention relates to a method and apparatus for qualifying valid data peaks occurring in a raw readout signal of the type encountered in a magnetic tape or disk drive data storage device.

In magnetic data storage devices, such as magnetic tape or magnetic disk drives, digital data is stored by selectively magnetizing a magnetic oxide material, or other magnetizable particles, coated on the surface of a suitable media, such as a tape or disk. Stored data is retrieved by creating relative motion between the media and a read head so that the varying magnetic flux associated with the stored data generates an electrical signal in the read head, which electical signal varies as a function of the intensity of the change in magnetic flux, and which change in magnetic flux, in turn, varies as a function of the stored data. This electrical signal generated within the read head is hereafter referred to as a "raw readout signal," and this term applies for purposes of this application whether the signal has been amplified or not, filtered or not, or otherwise buffered and processed prior to being applied to the data peak qualification circuitry of the present invention.

The amplitude of the raw readout signal is highest at a point coincident with the greatest change in magnetic flux. Such points of greatest flux change are typically used to indicate data transitions of the data being stored. Hence, in order to accurately recover or retrieve the stored data, it is necessary to detect this highest point of the raw readout signal, referred to hereafter as a signal or data peak. Because flux changes may occur in one of two directions, the signal peaks to be detected may be either positive or negative peaks.

Unfortunately, irregularities may exist in the magnetic recording media, and electrical noise or other sources of electrical irregularities may occur within the read/write channel causing more than one data peak to be present within the raw readout signal for a given data transition that is desired to be stored on the magnetic media. Therefore, for the data to be accurately retrieved from the storage media, some sort of method and apparatus is needed to qualify which of a plurality of data peaks are to be interpreted as a valid data peak. The present invention is directed to such a method and apparatus for qualifying valid data peaks.

It is known in the art to use threshold detectors to disqualify data peaks whose amplitude does not exceed a prescribed level. However, false data peaks may readily exceed a prescribed threshold, and therefore threshold detection is not, by itself, an adequate means for qualifying data peaks.

It is also known in the art to detect signal slope, in combination with signal amplitude change, in order to select or qualify valid data peaks. See, U.S. Pat. No. 3,631,263. While this approach represents a significant improvement over mere threshold detection, the circuitry required to realize such a scheme is quite complex and expensive to fabricate and maintain. Moreover, the signal slope, or shape of the peak, is not always an accurate indicator of which data peaks are valid and which are not.

SUMMARY OF THE INVENTION

It is an object of the present invention to provide an easy-to-implement method for qualifying valid data peaks in a read/write channel.

It is a further object of the present invention to provide an apparatus or circuitry that carries out the desired peak qualification method in a simple, straight forward manner, using components that are relatively inexpensive to obtain, and resulting in a circuit that is simple to manufacture and easy to maintain.

An additional object of the present invention is to provide an apparatus and method for qualifying valid data peaks occurring in the raw readout signal of a high performance magnetic tape or disk drive.

The above and other objects of the present invention are realized by processing the raw readout signal through three parallel channels. A first channel includes follow and hold circuitry that follows the signal level of the raw readout signal if the signal level is increasing, and holds the highest previously encountered signal level when the raw readout signal level is decreasing. The follow and hold circuitry also detects the occurrence of a prescribed polarity slope—positive or negative—within the raw readout signal so long as the amplitude of the raw readout signal at the point where the slope is detected exceeds the value held in the follow and hold circuitry. The net effect of the first channel is thus to detect signal slopes leading to increasingly higher amplitude data peaks within a given positive or negative region of the raw readout signal, and to not detect slopes leading to data peaks of lesser amplitude than previous data peaks.

A second channel through which the raw readout signal is processed includes peak detection circuitry for detecting all peaks that occur within the raw readout system.

A third channel through which the raw readout signal is processed includes threshold detection circuitry for detecting when the raw readout signal exceeds a prescribed threshold.

Also a part of the present invention is a polarity detector, which polarity detector defines positive or negative regions of the raw readout signal. This polarity detection may occur within a separate fourth channel, or in conjunction with the processing of the signal in the above-described three channels.

A data peak is *initially qualified* only if the simultaneous processing of the raw readout signal through the three parallel channels indicates a concurrence of: (1) from the first channel, a prescribed slope (positive or negative) leading to at least one data peak; (2) from the second channel, a data peak; and (3) from the third channel, an above-threshold signal level. Data peaks for a given polarity region of the raw readout signal—as defined by the polarity detector—are finally qualified by eliminating all but the last of a series of initially qualified peaks.

The method of the present invention may be summarized as follows:

(1) Detecting peaks in the raw readout signal and generating a peak output pulse indicating the presence of the peaks.
(2) Detecting the slopes in the raw readout signal that meet specified conditions of amplitude and polarity, including an above threshold signal level, and generating a slope output pulse indicating the presence of the detected slopes.

(3) Comparing the output pulses generated above in steps (1) and (2) and generating a qualified peak output pulse upon the occurrence of the two output pulses.

(4) Eliminating all but one of the qualified peak output pulses generated in step (3) whenever a plurality of the qualified output pulses occur within a same polarity region of the raw readout signal, thereby insuring that only one qualified peak output pulse remains for each of the same polarity regions of the raw readout signal.

BRIEF DESCRIPTION OF THE DRAWINGS

The above and other objects, features, and advantages of the present invention will be more apparent from the following more particular description thereof, presented in conjunction with the following drawings wherein.

DETAILED DESCRIPTION OF THE INVENTION

The following description is of the best presently comtemplated mode of carrying out the invention. This description is not to be taken in a limiting sense but is made merely for the purpose of describing the general principles of the invention. The scope of the invention should be determined with reference to the appended claims.

Figure 8:
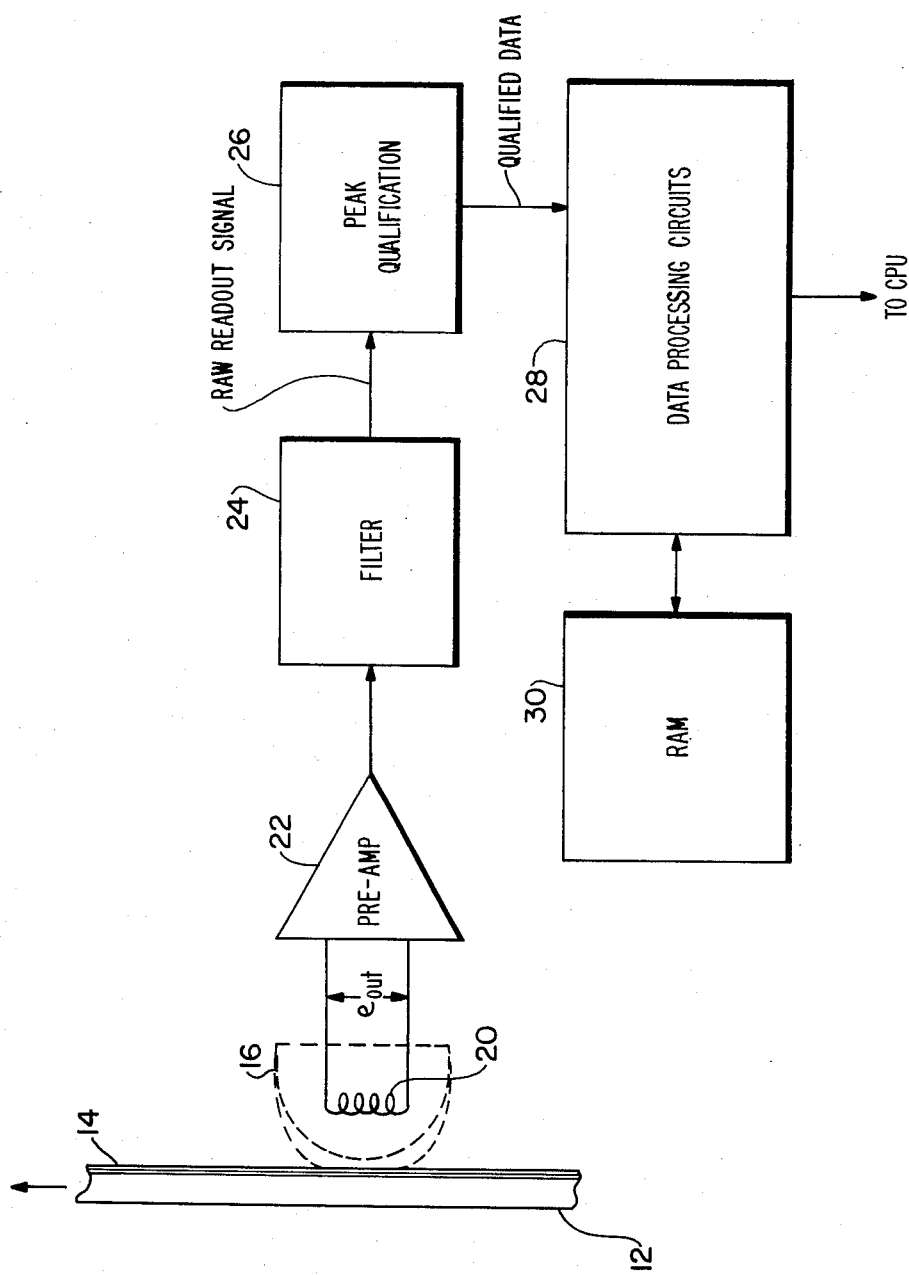
FIG. 8 is a simplified block diagram of a read channel of a magnetic tape or disk storage device.

Referring first to FIG. 8, there is shown a block diagram of some of the key components of a read channel of a magnetic tape or disk drive storage system. Such a system includes magnetic media 12 upon which a coating of oxide material 14 has been placed. The magnetic media 12 is physically moved with respect to a read head 16. Magnetic flux, represented as the dashed line 18 in FIG. 8, passes through the sense coils 20 of the read head 16 as the media 12 is passed thereby. Because of the movement of the magnetic media 12, the intensity of the magnetic flux 18 varies in a pattern representative of the data that has been stored thereon. This changing magnetic flux, in turn, induces a voltage $e_{out}$ across the terminals of the sense coil 20. This voltage $e_{out}$ is then amplified and buffered in a preamplifier 22, and may appropriately be filtered in a filter 24 (to remove unwanted noise, etc.) before being passed to peak qualification circuitry 26. The function of the peak qualification circuitry 26 is to qualify which data peaks present within the input signal to the peak qualification circuitry 26, which input signal comprises the "raw readout signal", constitute valid data peaks that should be interpreted as recorded data transitions on the magnetic media. The qualified data from the peak qualification circuitry 26 is then passed to appropriate data processing circuits 28, from where it may be temporarily stored in a random access memory (RAM) 30 or passed over a suitable channel to a central processing unit (CPU) for use by the CPU to perform a desired data processing function. It is the peak qualification circuitry 26 that comprises the subject matter of the present invention.

Figure 1:
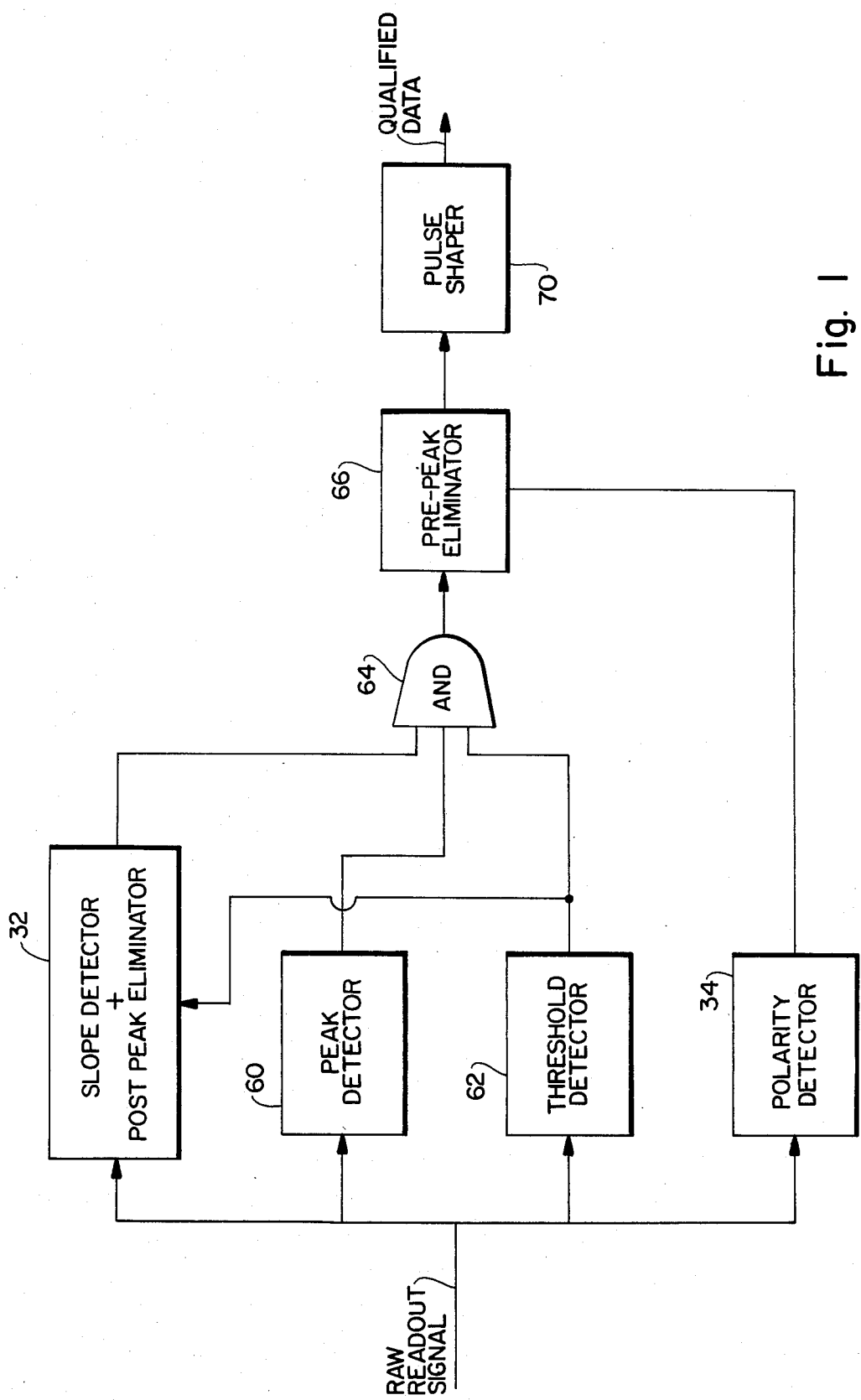
FIG. 1 is a simplified block diagram of the peak qualification circuitry of the present invention.
Figure 2:
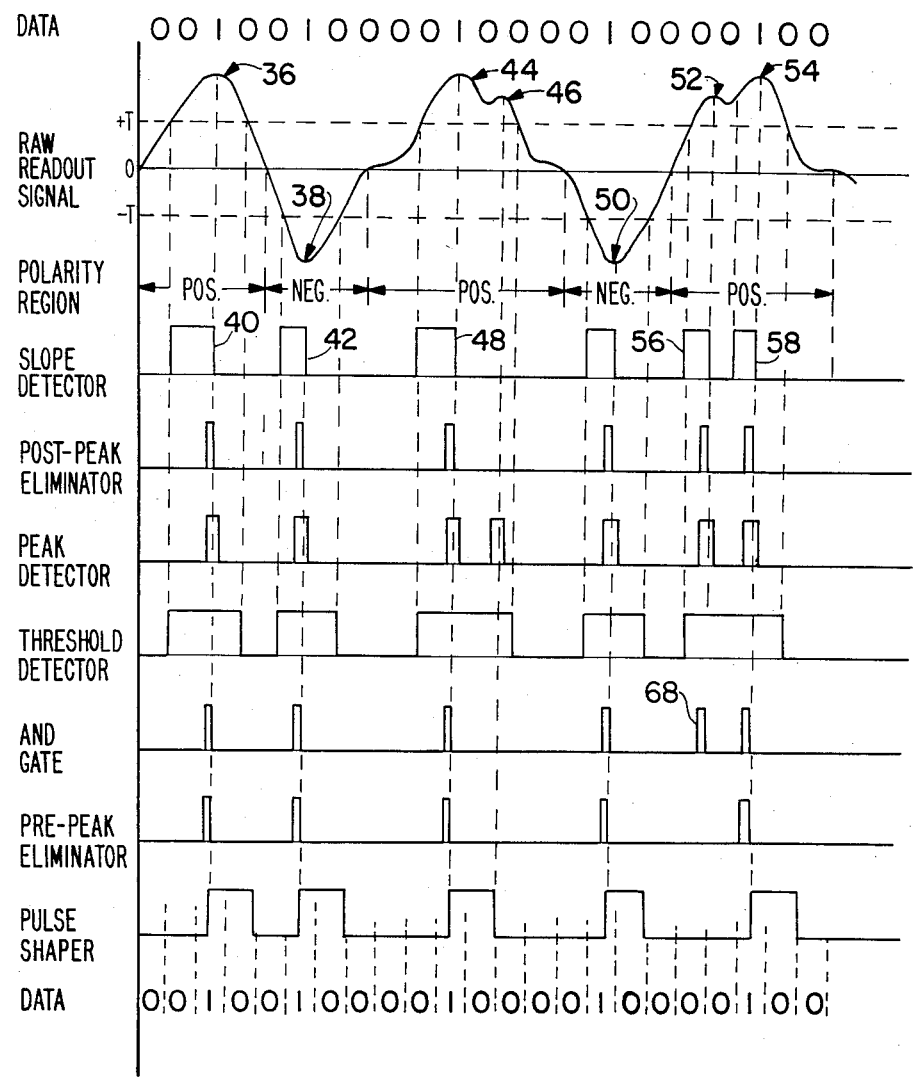
FIG. 2 is a signal timing diagram illustrating the operation of the circuit of FIG. 1.

Referring next to FIGS. 1 and 2, a block diagram of the peak qualification circuitry 26, and associated signal timing diagram, are illustrated. The peak qualification circuitry 26 includes three parallel channels through which the raw readout signal is processed. A first channel includes a Slope Detector and Post Peak Eliminator 32 whose function is to detect prescribed slopes within the raw readout signal that lead to a data peak within a given polarity region of raw readout signal. This concept is best illustrated in FIG. 2 where a typical waveform of the raw readout signal is shown. As indicated in FIG. 2, the raw readout signal includes both positive and negative peaks. A polarity detector 34 (FIG. 1) determines positive and negative regions of the raw readout signal as defined in FIG. 2. A positive region is that portion of the raw readout signal for which the signal amplitude exceeds a desired reference level, such as zero volts. Similarly, a negative region of the raw readout signal is that portion of the readout signal for which the amplitude thereof is less than a desired reference level. The reference level is indicated as zero (0) for the waveform shown in FIG. 2.

The Slope Detector 32 examines the raw readout signal and generates a slope-detected pulse or signal for that portion of the readout signal that exceeds a desired threshold level and that increases (whether the increase is positive or negative) to an amplitude peak. A separate slope-detected pulse or signal is generated for each peak within a desired polarity region of the raw readout signal so long as the peaks are of increasing amplitude. However, if a second peak within a same polarity region is of a lesser amplitude than a prior peak, then no slope-detected pulse is generated. Thus, in FIG. 2, it is seen that a first positive data peak is present at 36, and a first negative data peak is present at 38. Respective slope-detected pulses 40 and 42 are generated corresponding to each of these data peaks. However, it is seen that the negative data peak 38 is followed by two positive data peaks 44 and 46, with the data peak 46 being of lesser amplitude than the data peak 44. Hence, in accordance with the present invention, the Slope Detector 32 (FIG. 1) does not generate a slope-detected pulse corresponding to the second positive data peak 46 within the same polarity region as the first positive data peak 44 because the data peak 46 is of lesser amplitude than the data peak 44. Thus, only a single slope-detected pulse 48 is generated for the second positive polarity region of the raw readout signal.

Still referring to FIG. 2, it is seen that a second negative peak 50 is followed by two positive peaks 52 and 54, with the second data peak 54 being of higher amplitude than the first data peak 52. In this instance, and in accordance with the present invention, the Slope Detector 32 (FIG. 1) generates respective slope-detected pulses 56 and 58 corresponding to the occurrence of the two data peaks 52 and 54 of increasing amplitude. In summary, then, the Slope Detector and Post Peak Eliminator 32 serves the function of detecting slopes within the raw readout signal that lead to increasingly higher amplitude peaks within a given polarity region. As such, post-peaks (meaning peaks occurring after a first peak of higher amplitude) are eliminated, while pre-peaks (meaning peaks of lesser amplitude occurring prior to a data peak of higher amplitude) are not eliminated.

Referring back to FIG. 1, another channel through which the raw readout signal is processed includes a Peak Detector 60. It is the function of the peak detector to generate a peak-detected signal for every data peak that occurs within the raw readout signal. Thus, referring again to the timing diagram of FIG. 2, it is seen that a peak-detected pulse is generated for each data peak that occurs within the raw readout signal regardless of whether a peak is a single peak, a post-peak, or a pre-peak.

A Threshold Detector 62 is included in a third channel through which the raw readout signal is processed, as indicated in FIG. 1. As indicated in the timing diagram of FIG. 2, the threshold detector 62 generates an enabling signal or pulse (which may be thought of as a gate signal) whenever the raw readout signal exceeds a prescribed threshold. In FIG. 2, the threshold is indicated as a dashed line $+T$ or $-T$ that is superimposed over the raw readout signal.

The detected signals or pulses generated by each of the three channels described above are functionally combined in an AND circuit 64, the output of which represents the coincidence or simultaneous occurrence of a signal from all three channels. Thus, as indicated in FIG. 2, the output of the AND gate circuit 64 represents a series of pulses that coincide with the occurrence of a pulse from the Slope Detector and Post Peak Eliminator 32, a pulse from the Peak Detector 60, and a signal or pulse from the Threshold Detector 62.

As indicated in FIG. 1, the output of the AND circuit 64 is directed to a Pre-Peak Eliminator circuit 66, the function of which is to eliminate pre-peaks within a given polarity region of the raw readout signal. Hence, the initially qualified data peak 68 (FIG. 2) from the AND gate circuitry 64 is eliminated by the Pre-Peak Eliminator 66. Functionally, the Pre-Peak Eliminator circuit 66 examines each polarity region of the raw readout signal and determines if more than one initially qualified peak is present. If so, all but the last of such peaks are eliminated.

Finally, the output of the Pre-Peak Eliminator 66 is directed to a pulse shaping circuit 70 that converts the pre-peak eliminator output pulses to a form that will be recognizable as a valid data signal. This process is also illustrated in FIG. 2 where the representation of the digital data is indicated by means of a series of 1's and 0's. For example, at the top of FIG. 2, it is seen that the data "1" corresponds to a peak within the raw readout signal. As the various pulses or signals are generated by the circuitry shown in FIG. 1, it is seen that the qualified data, comprising the output of the pulse shaping circuit 70, is representative of the same digital data stream, where the data transitions from a low to a high level represent a binary 1, and where no data transition represents a binary "0".

Figure 3:
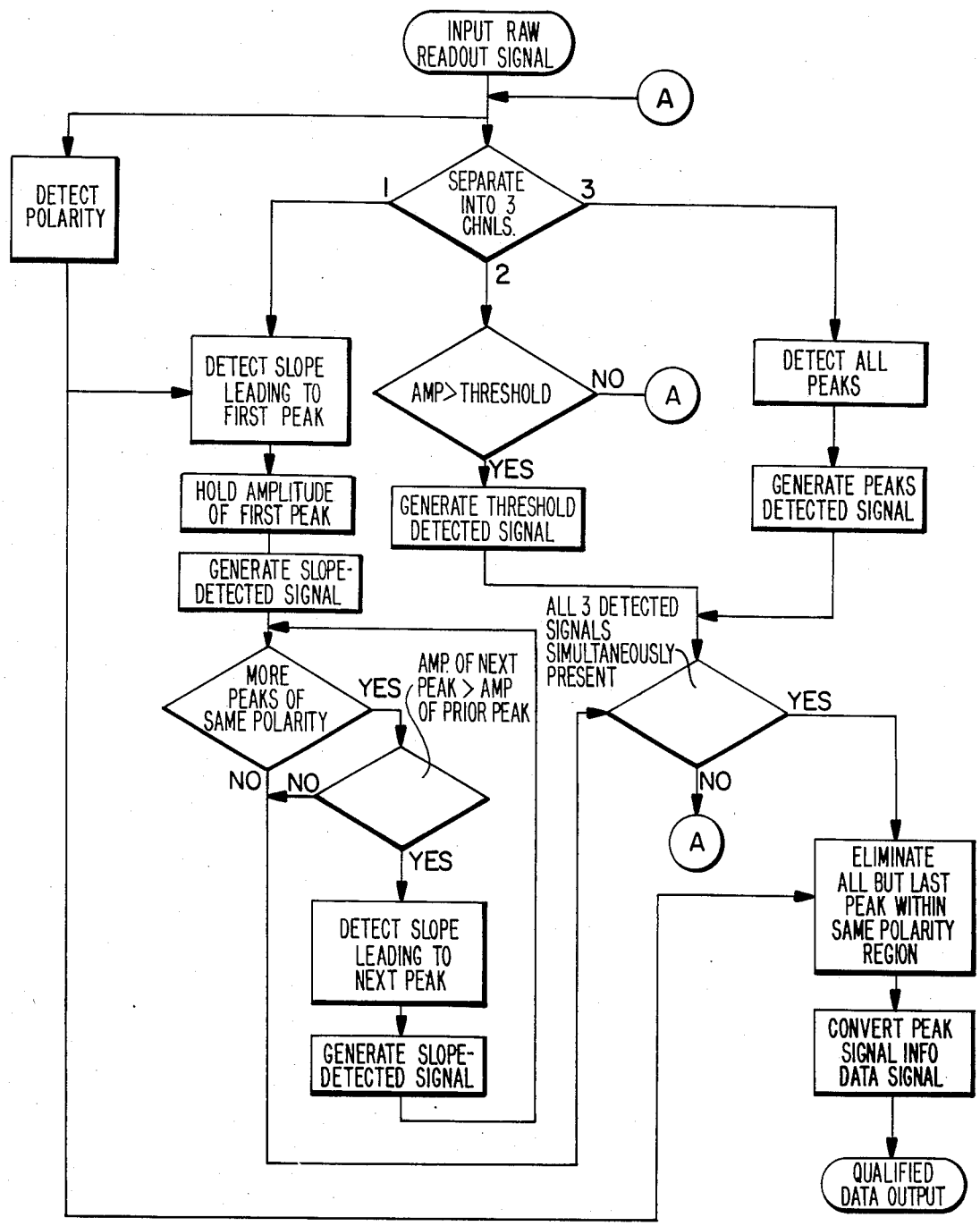
FIG. 3 is a flow diagram illustrating the method of qualifying valid data peaks in accordance with the present invention.

Referring next to FIG. 3, a flowchart is shown that depicts the method of qualifying valid data peaks as has been described above in connection with FIGS. 1 and 2. As indicated in FIG. 3, the raw readout signal represents the input signal that is separated into three channels. In the first channel, the slope (positive or negative) leading to the first peak within a given polarity region of the raw readout signal is detected. The amplitude of this first peak is held for future reference, and a slope-detected signal or pulse is generated. An examination is then made as to whether there are any additional peaks within the same polarity region of the raw readout signal. If so, a determination must be made as to whether the amplitude of the subsequent peaks is greater than the amplitude of the previously detected peak. If so—that is if the subsequent peak is of higher amplitude—then the slope leading to the next peak is also detected and another slope-detected signal is generated. This process continues for so long as there are additional peaks of increasingly higher amplitudes occurring within the same polarity region of the raw readout signal.

In a second channel, the amplitude of the raw readout signal is examined to determine if it exceeds a prescribed threshold. If so, a threshold-detected signal is generated.

In a third channel, all peaks occurring within the raw readout signal are detected, and a corresponding peak-detected signal is generated.

The detected signals generated in the three channels are then compared to determine if all three detected signals—the slope-detected signal, the threshold-detected signal, and the peak-detected signal—are simultaneously present. If so, the resulting signal is further processed to eliminate all but the last peak within the same polarity region. The remaining peak signals are then converted into a data signal that functions as a qualified data output.

Figure 4:
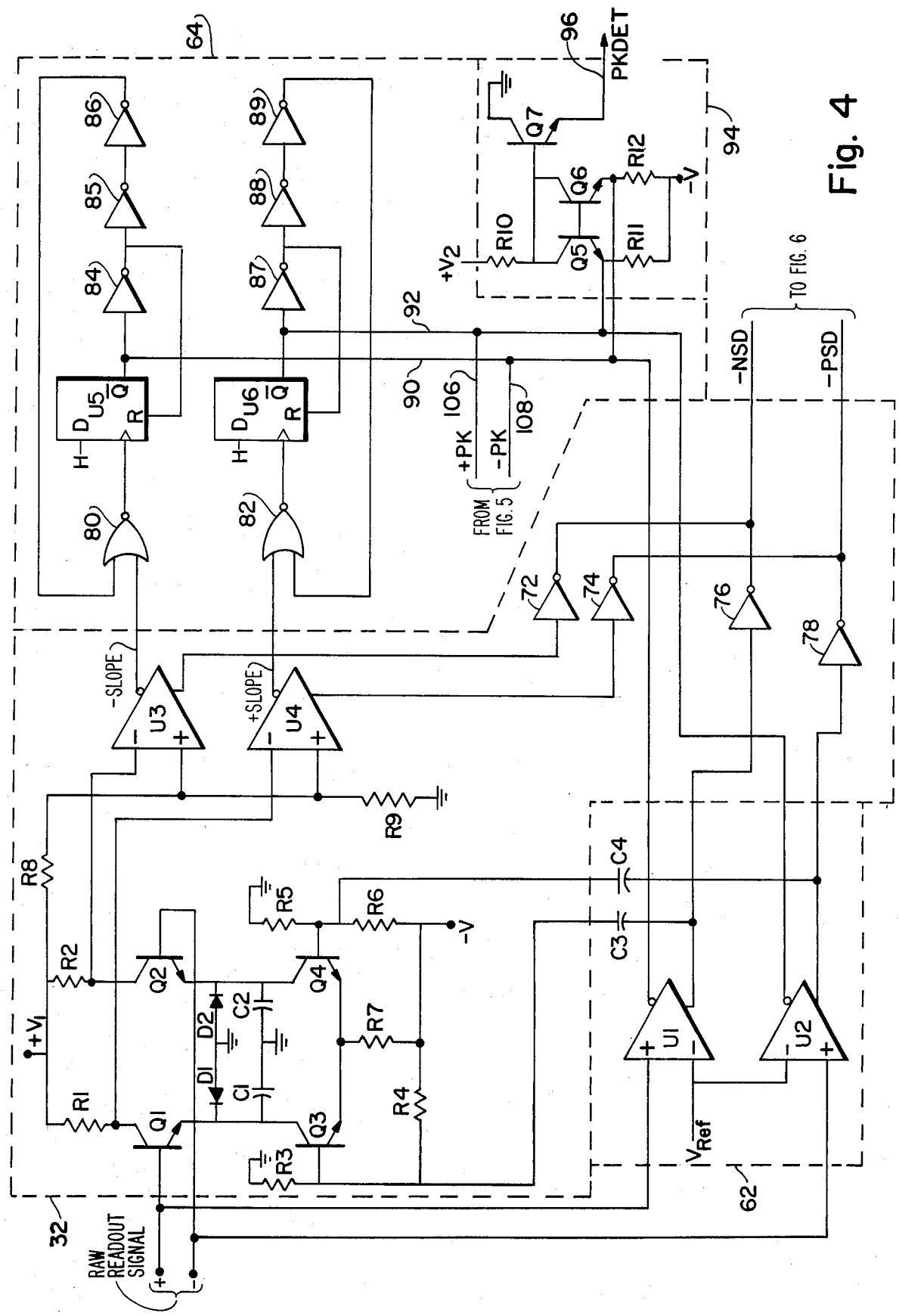
FIG. 4 is a schematic/logic diagram of the Slope Detector and Post Peak Eliminator, the Threshold Detector, and the AND circuit of FIG. 1.
Figure 5:
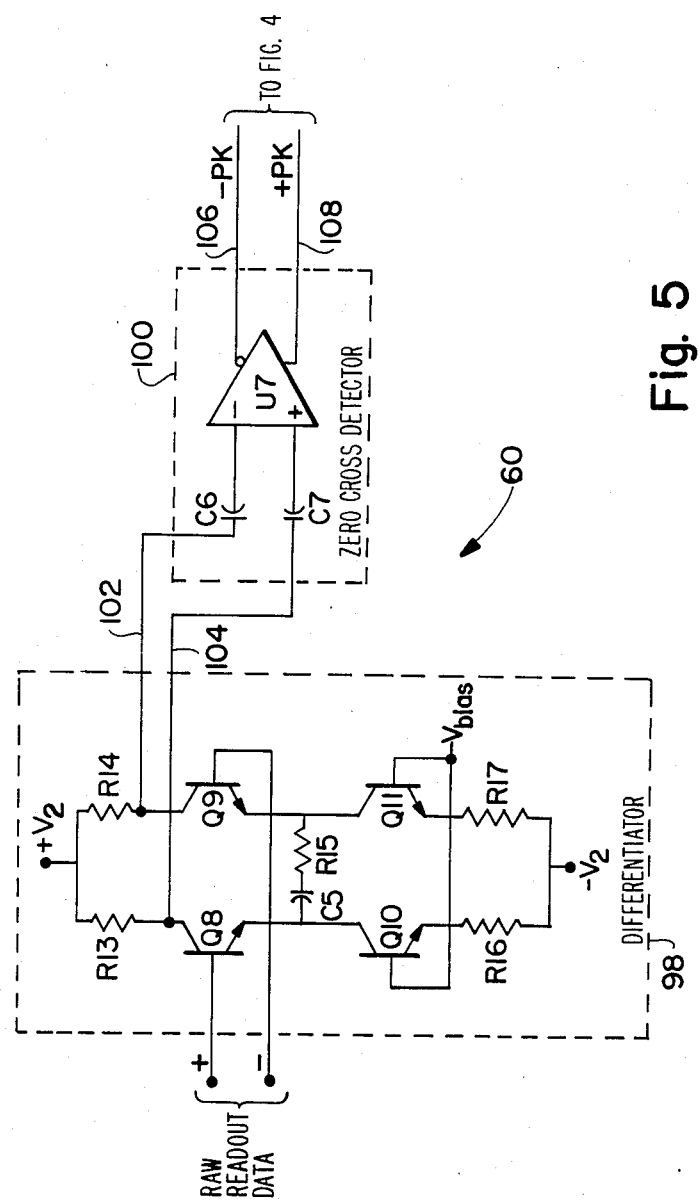
FIG. 5 is a schematic/logic diagram of the Peak Detector of FIG. 1.
Figure 6:
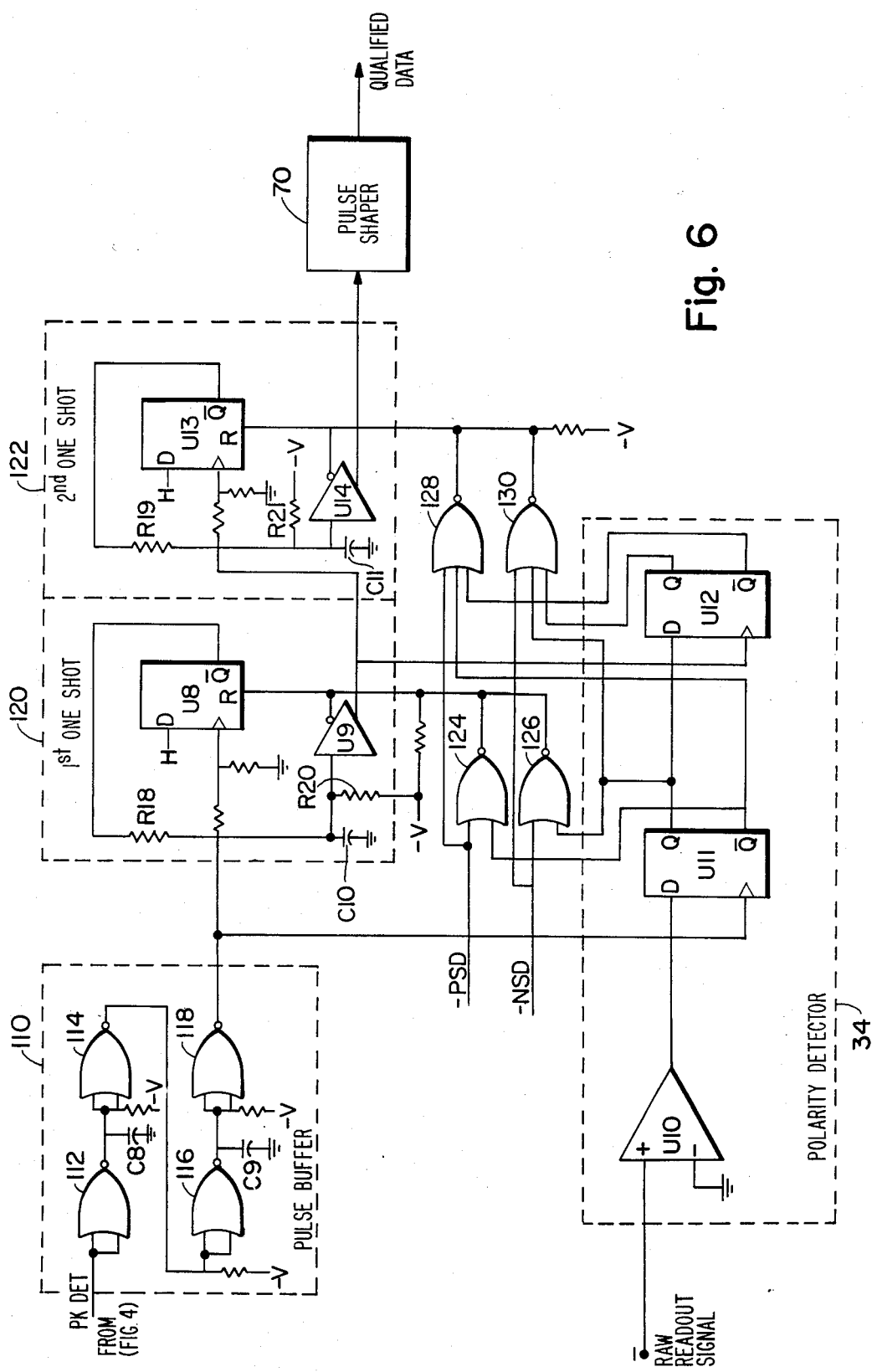
FIG. 6 is a schematic/logic diagram of the Polarity Detector and Pre-Peak Eliminator of FIG. 1.

Referring next to FIGS. 4–7, schematic/logic diagrams of the preferred embodiment of the present invention are shown, along with a timing diagram that helps explain some of the key signals associated with the operation thereof. In FIG. 4, the schematic/logic diagram of the Slope Detector and Post Peak Eliminator 32 is shown, along with the schematic/logic diagram of the Threshold Detector 62 and the AND circuit 64. In FIG. 5, the schematic/logic diagram of the Peak Detector 60 is shown, while in FIG. 6 the schematic/logic diagram of the Pre-Peak Eliminator 66 is illustrated. It is to be noted that the Schematic/logic diagrams shown in FIGS. 4–6 are simplified in that many of the necessary interconnections, such as the connection of power lines to various integrated circuits, the use of pull-down resistors, and the like, are not shown. However, given the detail that is shown in these figures, those skilled in the art would readily be able to realize the desired circuits in a suitable fashion. It is also to be emphasized that the preferred embodiment of the present invention is realized using ECL (emitter coupled logic) circuitry. However, as those skilled in the art will recognize, the equivalent circuit functions could readily be realized using other forms of logic circuitry, such as TTL or CMOS circuitry.

Referring to FIG. 4, the operation of the Slope Detector and Post Peak Eliminator circuit 32 will now be explained. The raw readout signal, which in the preferred embodiment is a differential signal (and therefor present on two signal lines, indicated as + and −) is presented to the base terminals of transistors Q1 and Q2. The collectors of Q1 and Q2 are connected through resistors R1 and R2 respectively to a desired regulated positive supply voltage $+V_1$. The emitters of transistors Q1 and Q2 are respectively connected to the collectors of transistors Q3 and Q4. Capacitors C1 and C2 are connected back-to-back between the collectors of transistors Q3 and Q4, with a center point being grounded. Similarly, diodes D1 and D2 are connected between the emitters of transistors Q1 and Q2 such that their anodes are tied to a common ground point, and their cathodes are respectively connected to the emitters of transistors Q1 and Q2. The emitters of transistors Q3 and Q4 are tied together and connected through a resistor R7 to a negative supply voltage $-V$. The base terminals of transistors Q3 and Q4 are biased at an appropriate voltage level by means of resistors R3, R4, and resistors R5, and R6. The base terminals of Q3 and Q4 are also connected to the output of the Threshold Detector 62.

The collector terminals of transistors Q1 and Q2 are connected to respective negative input terminals of threshold amplifiers U3 and U4. Both of these amplifiers U3 and U4 have their positive input terminals connected to a voltage reference level set by the voltage-divider network of resistors R8 and R9. The non-inverting output of amplifiers U3 and U4 are routed through inverter gates 72 and 74 and wire OR'd with similar outputs from threshold detector amplifiers U1 and U2 used within the threshold detector 62. That is, the Threshold Detector 62 includes threshold detecting amplifiers U1 and U2, having their negative input terminals connected to a desired threshold voltage reference $V_{Ref}$. The positive terminals of these amplifiers are connected to the respective signal lines of the raw readout signal. The non-inverting output of the threshold amplifiers U1 and U2 is directed through coupling capacitors C3 and C4 to the base terminals of transistors Q3 and Q4, as previously described. This same non-inverting output of each amplifier U1 and U2 is respectively directed through inverting gates 76 and 78 to the point where each is wire OR'd with the corresponding signals from the threshold amplifiers U3 and U4.

The inverting output of threshold amplifiers U3 and U4 is respectively directed to one of the two input lines of a NOR gate 80 or 82. The output of each NOR gate is directed to a respective D-type flip flop U5 and U6, which has its D input tied high. The flip flop U5 has its inverted Q output connected to a series of three inverter gates 84, 85, and 86, with the output of inverter gate 86 being connected back into one of the inputs of NOR gate 80. The output of the first inverter gate 84 is connected back to the reset terminal of the flip flop U5. A similar configuration is presented with respect to flip flop U6, where the three inverter gates are designated as 87, 88, and 89, with the output of inverter gate 89 being connected to one of the inputs of NOR gate 82, and the output of inverter gate 87 being tied to the reset input of flip flop U6.

The inverted Q outputs of flip flops U5 and U6 are tied to signal lines 90 and 92 respectively. Also connected to signal line 90 is the inverted output of threshold amplifier U1 used within the threshold detector 62. Similarly, the inverted output of threshold amplifier U2, also used within the threshold detector 62, is tied to signal line 92. A buffer circuit 94, including any array of transistors Q5, Q6, with respective emitter resistors R11 and R12, and Q7, is also coupled to signal lines 90 and 92. It is the function of the buffer circuit 94 to combine signal pulses appearing on either signal lines 90 and 92 and place them through transistor Q7 on a single signal line 96 (also labeled PKDET).

Figure 7:
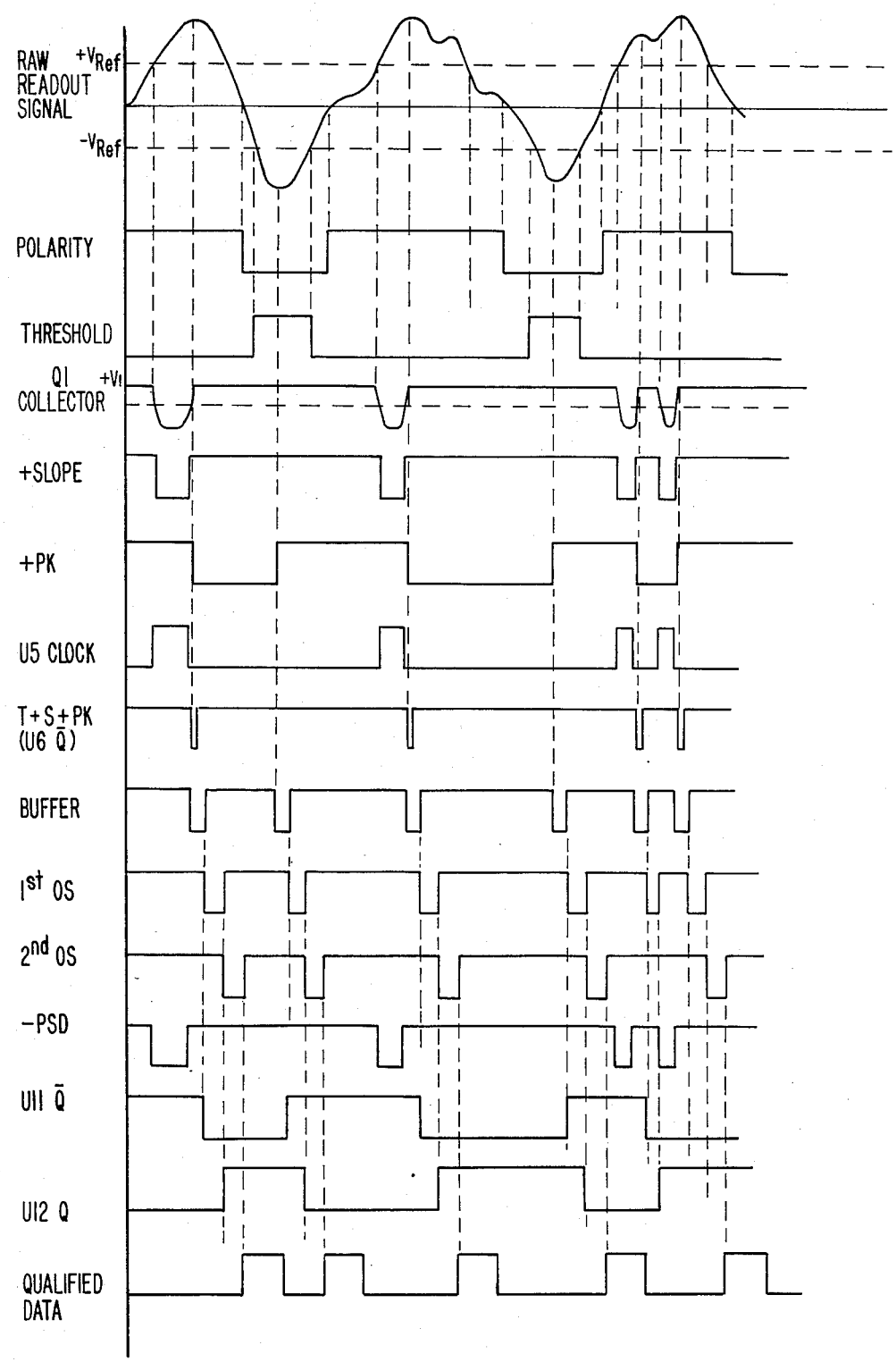
FIG. 7 is a timing diagram illustrating some key signals associated with the operation of the circuits of FIGS. 4-6.

Referring next to FIG. 5, the schematic/logic diagram of the Peak Detector 60 is illustrated. As indicated in FIG. 5, the peak detector 60 comprises a differentiator circuit 98 and a zero cross detector circuit 100. As those skilled in the art will recognize, when any analog signal is differentiated, a signal is generated that will change polarity whenever there is a change in the polarity of the slope. Hence, the output of the differentiator circuit 98, appearing on signal lines 102 and 104 will be a signal that crosses zero at every point there is a data peak within the readout signal. This is because a data peak, by definition, represents a portion of the readout signal having a positive or negative slope on one side of the peak and a corresponding negative or positive slope on the other side of the peak. Thus, by using a conventional differentiator circuit 98 in conjunction with a conventional zero cross detector circuit 100, the desired data peak detection circuitry 60 is realized. The output signals of the Peak Detector circuit 60 appear on signal lines 106 and 108, and are also designated as +PK and −PK. These same signal lines are shown on FIG. 4 as being wire OR'd to the signal lines 90 and 92 respectively. The +PK signal is shown in FIG. 7. Note that each transition of this signal represents the detection of a data peak.

The operation of the circuits of FIGS. 4 and 5 will now be explained in conjunction with the timing diagram of FIG. 7. The raw readout signal is presented to the inputs of the threshold amplifiers U1 and U2 of the threshold detector 62. This same signal is presented to transistors Q1 and Q2 of the Slope Detector and Post Peak Eliminator circuit 32. Transistors Q3 and Q4 function as switches that turn on and drain the charge on capacitors C1 and C2 respectively during the time that the raw readout signals at the bases of Q1 and Q2 respectively are below a specified threshold (which for the implementation shown in FIG. 4 is close to ground). Diodes D1 and D2 define the voltage to which capacitors C1 and C2 are reduced when transistors Q3 and Q4 are respectively turned on. The application of the raw readout signal to the base terminals of transistors Q1 and Q2 has no effect so long as the signal polarity is negative. However, as soon as the desired threshold level is exceeded, the amplitude of the raw readout signal is passed through to the emitter of transistors Q1 and Q2 and held or stored on capacitors C1 and C2. For so long as the signal level is increasing, current is pulled through the appropriate resistor R1 or R2, generating a detectable signal at the collector of Q1 or Q2.

To further illustrate this action, consider the timing diagram of FIG. 7. As the raw readout signal increases in the positive polarity direction, transistor Q1 turns on and this allows the amplitude of the raw readout signal to pass through the emitter of Q1 and be held on capacitor C1. The signal level held on C1 will continue to increase with an increase in the level of the raw readout signal. During this time, current is flowing through Q1 and R1, causing the voltage at the collector of Q1 to decrease. As soon as the raw readout signal decreases in amplitude below the value of the signal level held on C1, transistor Q1 becomes back-biased, and Q1 turns off, which action also shuts down the current flowing through R1, thereby causing the voltage at the collector of Q1 to increase back to the $+V_1$ reference level. Throughout the same polarity region, no additional current is allowed to flow through R1 (and hence no additional slope detected pulses may be generated) unless the raw readout signal level applied to the base of Q1 exceeds the signal level held on capacitor C1. As soon as the raw readout signal drops below the threshold level $-V_{Ref}$, capacitor C1 discharges and gets ready to receive a signal level for the next positive polarity region.

The signal pulse at the collector of Q1 is directed to threshold amplifier U4, the output of which is represented as the signal +SLOPE in FIGS. 4 and 7, indicating that a positive slope in the raw readout signal has been detected. This signal passes through NOR gate 82 and is directed to flip flop U6 as its clock input. A pulse of this type applied to the clock input, coupled with the fact that the D input is held high, causes the inverted Q output of flip flop U6 to want to revert to its low state. However, even though the inverted Q output is trying to pull signal line 92 to a low state, such a condition cannot actually occur until all of the signal lines that are wire OR'd to signal line 92 also go to a low state. Thus, the threshold signal from amplifier U2 (which is the inverse from that shown in FIG. 7), as well as the +PK signal from the peak detector circuit 60 (FIG. 5) must also go low. As soon as the last of these three signals goes low, which last signal is typically the +PK signal, then signal line 92 can go low. A short time thereafter, the output of inverted gate 87 will go high, which high signal is directed back to the reset terminal of flip flop U6, causing the flip flop U6 to be reset, which action causes the inverted Q output to go high, thereby causing signal line 92 to also go high. Thus, the net effect is that a very narrow pulse appears on signal line 92 that represents the simultaneous occurrence of a threshold pulse, a +SLOPE pulse, and a +PK pulse. It is thus seen that flip flop U5 and U6, and their associated circuitry, including signal lines 92 and 90 and the other signal lines that are wire OR'd thereto, realize the AND circuit 64 function described in connection with the simplified block diagram of FIG. 1.

The Pre-Peak Eliminator circuit 66 (FIG. 1) will now be described in conjunction with FIG. 6 and FIG. 7. The PKDET signal from buffer circuit 94, which is the combination of the signals appearing on signal lines 92 and 90, is presented to a pulse buffer circuit 110. This buffer circuit 110 includes a series of NOR gates 112, 114, 116, and 118 that are connected as inverter gates. Capacitors C8 and C9 are connected to the output of gate 112 and 116 respectively. The function of the pulse buffer circuit 110 is essentially to widen the pulse width and delay the trailing edge thereof. The output of the pulse buffer circuit is directed to a first one shot 120, which delays the pulse an appropriate amount, as indicated in FIG. 7. The output of the first one shot 120 is then directed to a second one shot 122, which likewise delays the first delayed pulse an appropriate amount. The output of the second one shot 122 is directed to the pulse shaper 70, the output of which represents the qualified data as discussed previously in connection with FIG. 1. NOR gates 124, 126, 128, and 130 are used in conjunction with the operation of the first one shot 120 and the second one shot 122, as illustrated in FIG. 6, in order to eliminate any pre-peaks occurring within the same polarity region of the raw readout signal. This operation will now be explained.

As indicated in FIG. 6, the polarity detector 34 comprises a threshold amplifier U10, and flip flops U11 and U12. Flip flop U11 is triggered or clocked by the buffered PKDET signal that is also used to trigger the first one shot 120. Flip flop U12 is triggered or clocked by the output of the first one shot 120. The outputs of flip flops U11 and U12 therefore indicate the polarity of the raw readout signal, one signal (U12) being slightly delayed from the other (U11). This is illustrated in FIG. 7 where the inverted Q output of U11 is shown, as is the non-inverted Q output of U12.

The NOR gates 124, 126, 128, and 130 are configured such that the operation of either the first one shot 120 or the 2nd one shot 122 can be reset during the processing of a pre-peak. Whether the first one shot or the second one shot is reset depends on the proximity of the pre-peak to the peak of greater amplitude which it preceeds. The one shots 120 and 122 are reset with a high level signal at the reset terminal of U8 or U13 whenever the −PSD or −NSD inputs to NOR gates 124, 126, 128 and 130 go low, giving advance notice that a higher peak is coming, and when the polarity detector outputs (flip flops U11 and U12) are poised in such way as to direct the gating to the reset pin of the proper single shot at the proper time.

As indicated in FIG. 6, each flip flop is realized by using a flip flop and an ECL receiver circuit. For example, the first one shot 120 includes flip flop U8 and receiver circuit U9 as well as capacitor C10 and resistor R18. In operation, the buffered PKDET signal triggers flip flop U8 by clocking it to a "zero" state, which causes the inverted Q output to go low. This low signal causes capacitor C10 to be discharged through resistor R18 in a controlled manner, depending upon the particular value of the components used. As soon as the threshold level of receiving circuit U9 is reached, the inverted output thereof, connected to the reset terminal of flip flop U8 goes high, thereby resetting flip flop U8. This resetting action allows capacitor C10 to charge through resistor R20, thereby allowing the reset line of flip flop U8 to go low, thereby allowing the flip flop to be retriggered by the next PKDET pulse appearing at the clock input thereof providing the outputs of NOR gates 124 and 126 also remain low. The operation of the second one shot 122, realized with flip flop U13, capacitor C11, resistors R19 and R121, and receiver circuit U14 is the same.

In the preferred embodiment, the pulse shaper circuit 70 may be realized with a third one shot that is realized in the same manner as are the first one shot 120 and the second one shot 122. The function of the pulse shaper circuit 70 is to convert the pulses coming from the second one shot 122 to a constant width, commensurate with the data rate that is being used, which conversion can readily be accomplished using a third one shot triggered off the trailing edge of the pulses coming from the second one shot 122.

In the preferred embodiment, quad transistors Q1, Q2, Q3, and Q4, as well as Q8, Q9, Q10, and Q11, and Q5, Q6, and Q7 may be realized using a quad transistor array commercially available as No. CA3046, manufactured by Motorola, Signetics, and other semiconductor vendors. Similarly, threshold amplifiers U1, U2, U3, U4, U7, and U10 may all be realized using an MC1650 threshold amplifier, manufactured by Motorola, Fairchild, and numerous other semiconductor manufacturers. Flip flops U5, U6, U8, U11, U12, and U13 may all be realized using a 10131 D flip flop, also manufactured by Motorola, Fairchild, Signetics, and other manufacturers. All logic inverter gates and dual input NOR gates may be realized using a 10102 dual input NOR gate, and the triple input NOR gates 128 and 130 may be realized using a 10106 NOR gate, all NOR gates being ECL gates that are manufactured by Motorola, Fairchild, Signetics, or other manufacturers. THE ECL Receiver circuits U9 and U14 used within the one shots 120 and 122 are realized with a 10114 device, manufactured by the same group of vendors indicated above. Thus, it is seen that the entire peak qualification circuitry may be realized using a very small number of different components, thereby simplifying the manufacture and operation, including maintenance, thereof.

While the invention herein disclosed has been described by means of specific embodiments and applications thereof, numerous modifications and variations can be made thereto by those skilled in the art without departing from the spirit and scope of the present invention. It is therefor to be understood that within the scope of the appended claims, the invention may be practiced otherwise than specifically described therein.

What is claimed is:

1. A method for qualifying data peaks in a raw readout signal comprising the steps of:
   (a) detecting peaks in said raw readout signal and generating a peak output pulse indicating said peaks;
   (b) detecting slopes in said raw readout signal meeting specified conditions of amplitude and polarity, and generating a slope output pulse indicating said slopes;
   (c) comparing the two output pulses generated in steps (a) and (b), and generating a qualified peak output pulse upon the occurrence of said two output pulses; and
   (d) eliminating all but one of the qualified peak output pulses generated in step (c) whenever a plurality of said qualified peak output pulses occur within a same polarity region of the raw readout signal, whereby only one qualified peak output pulse remains for each of the same polarity regions of said raw readout signal.

2. The method of claim 1 wherein step (b) comprises, for each same polarity region of said raw readout signal,
   (b)(1) generating a first of said slope output pulses indicating the occurrence of a prescribed polarity slope within said raw readout readout signal, said prescribed polarity slope comprising a positive slope for a positive polarity region of said raw readout signal, and a negative slope for a negative polarity region of said raw readout signal,
   (b)(2) generating a second of said slope output pulses only upon the occurrence of the same prescribed polarity slope of the raw readout signal at an amplitude that exceeds the highest amplitude of the raw readout signal associated with the first slope output pulse and,
   (b)(3) similarly generating subsequent slope output pulses only upon the subsequent occurrence of the same prescribed polarity slope of the raw readout signal at an amplitude that exceeds the highest amplitude associated with the previous slope output pulse.

3. The method of claim 2 wherein step (d) comprises eliminating all but the last qualified peak output pulse of a train of such pulses occurring within the same polarity region of said raw readout signal.

4. The method of claim 1 wherein the comparison of step (c) comprises logically combining the two output pulses generated in steps (a) and (b), such that the qualified peak output pulse is generated only when both output pulses are simultaneously present.

5. The method of claim 1 further including the step of detecting the amplitude of said raw readout signal and generating a threshold output pulse whenever the amplitude exceeds a prescribed threshold, and wherein step (c) comprises comparing the two output pulses generated in steps (a) and (b), with said threshold output pulse, and generating said qualified peak output pulse only upon the simultaneous occurrence of said threshold output pulse and the two output pulses generated in steps (a) and (b).

6. The method of claim 1 wherein step (a) comprises
   (a)(1) differentiating said raw readout signal,
   (a)(2) detecting the zero crossings of said differentiated raw readout signal, and
   (a)(3) generating said peak output pulses in response to each occurrence of the zero crossing detected in step (a)(2).

7. A circuit for qualifying data peaks in a raw readout signal comprising:
   slope detecting channel means for detecting slopes in said raw readout signal that meet specified conditions of amplitude and polarity, and for generating a slope output pulse in response to the detection of said slopes;
   peak detection channel means for detecting data peaks in said raw readout signal, and for generating a peak output pulse in response to the detection of said data peaks;
   channel combining means for combining said slope output pulse and said peak output pulse and for generating a qualified peak pulse upon the occurrence of both said slope output pulse and said peak output pulse; and
   eliminating means for eliminating all but one of the qualified peak pulses whenever a plurality of said qualified peak output pulses occur within a same polarity region of said raw readout signal, whereby only one qualified peak output pulse remains for each of the same polarity regions of said raw readout signal.

8. The circuit of claim 7 wherein said slope detecting channel means comprises:
   a differential amplifier that includes follow and hold circuitry for directing the signal level of the raw readout signal to a storage element, the signal level held on said storage element following any increases in the signal level of the raw readout signal, but not any decreases in the level of the raw readout signal within the same polarity region of the raw readout signal, said differential amplifier further including signal slope detection means for generating a slope-dectected signal only in response to the occurrence of an increase in the amplitude of the raw readout signal beyond that signal level held by said storage element;
   threshold detection means for generating said slope output pulse only when said slope-detected signal exceeds a prescribed threshold; and
   discharge means for zeroing the signal level held on the storage element at the beginning of an over-threshold condition of a following opposite polarity region of the raw readout signal.

9. The circuit of claim 8 furhter including threshold detection channel means for detecting when the raw readout signal exceeds a prescribed threshold level, and for generating a threshold enabling signal in response to detecting that the raw readout signal exceeds the prescribed threshold, said channel combining means further including means responsive to said threshold enabling signal for generating said qualified peak pulse only when enabled by said threshold enabling signal.

10. The circuit of claim 9 further including polarity detection channel means for generating a polarity signal indicating the polarity of the raw readout signal, said polarity signal being used to define a positive and a negative polarity region of said raw readout signal.

11. The circuit of claim 10 wherein said eliminating means comprises pulse elimination circuitry for eliminating all but the last of a sequence of said qualified peak output pulses occurring within the same polarity region of said raw readout signal.

12. The circuit of claim 7 wherein said slope detecting channel means comprises first means for generating said slope output pulse in response to the occurrence of a prescribed polarity slope within said raw readout signal, said first generating means including switch means adapted to switch on when said raw readout signal exceeds a preselected threshold and off when the slope of said raw readout signal is zero, wherein said slope output pulse is generated by said first generating means when said switch means is in an on condition, said prescribed polarity slope comprising a positive slope for a positive polarity region of said raw readout signal, and a negative slope for a negative polarity region of said raw readout signal; and second means for generating said slope output pulse, said second generating means including signal storage means for storing a greatest amplitude of said raw readout signal when said switch means is in an on condition, wherein said second generating means is adapted to turn on said switch means when said greatest amplitude is exceeded by a subsequent occurrence of the same prescribed polarity slope.

13. The circuit of claim 12 wherein said eliminating means comprises pulse elimination circuitry for eliminating all but the last of a sequence of said qualified peak output pulses occurring within the same polarity region of said raw readout signal.

14. The circuit of claim 13 further including pulse shaping circuitry, responsive to the remaining qualified peak output pulse from the pulse elimination circuitry, for generating a data pulse having a predetermined width, said data pulse representing the data contained within the raw readout signal.

* * * * *